United States Patent [19]

Fukunaga et al.

[11] Patent Number: 5,095,379
[45] Date of Patent: Mar. 10, 1992

[54] COLOR FILTER, LIQUID CRYSTAL DISPLAY USING SAME AND METHOD OF REPAIR THEREOF BY USING A NEGATIVE PHOTOSENSITIVE RESIN

[75] Inventors: Tetsuya Fukunaga, Sagamihara; Ayumi Ikeda, Yokohama; Toshihiro Ueki, Machida, all of Japan

[73] Assignee: International Business Machines Corporation, Armonk, N.Y.

[21] Appl. No.: 685,386

[22] Filed: Apr. 15, 1991

[30] Foreign Application Priority Data

Apr. 13, 1990 [JP] Japan .................... 2-96649

[51] Int. Cl.$^5$ .................................. G02F 1/13
[52] U.S. Cl. .......................... 359/68; 359/72; 430/91; 430/143
[58] Field of Search .......... 350/339 F, 339 R, 334, 350/336, 311; 430/7, 43, 91-139, 143, 357, 358, 359, 360, 362, 394

[56] References Cited

U.S. PATENT DOCUMENTS

| | | | |
|---|---|---|---|
| 4,946,259 | 8/1990 | Matino et al. | 350/339 F |
| 4,948,706 | 8/1990 | Sugihara et al. | 350/339 F X |
| 5,008,166 | 4/1991 | Aoki | 430/7 |

FOREIGN PATENT DOCUMENTS 63-128302 5/1988 Japan .
1152449 6/1989 Japan .

OTHER PUBLICATIONS

T. Fukuchi et al. "Self-Alignment Fabrication of ITO Electrode Pattern On Electrodeposited Tricolor Filter in Black Matrix; An Application to STN-LCD" Japan Display '89, Oct. 16, 1989, pp. 388-391.

*Primary Examiner*—Stanley D. Miller
*Assistant Examiner*—Huy K. Mai
*Attorney, Agent, or Firm*—David Aker

[57] ABSTRACT

Color filters, including those used in a liquid crystal display, aee repaired in a self-aligning manner. Defective parts of the colored pixels of a filter are filled with a negative type photosensitive resin containing a pigment of the same color as the colored pixel. The photosensitive resin is exposed to light through the defective colored pixels and the exposed resin is developed. When the defect extends through pixels of different colors, a gray colored resin is utilized. The gray colored resin has a color temperature equal to that of the white color temperature resulting from the additive color process of the colors of the various colored pixels of the filter.

11 Claims, 5 Drawing Sheets

COLOR FILTER, LIQUID CRYSTAL DISPLAY USING SAME AND METHOD OF REPAIR THEREOF BY USING A NEGATIVE PHOTOSENSITIVE RESIN

FIELD OF THE INVENTION

This invention relates to color filters. More particularly it relates to color filters suitable for use in a liquid crystal display device and a method for repairing such filters.

BACKGROUND ART

Manufacturing methods for color filters used in color liquid crystal display devices include the dyeing method, the electrodeposition method, the printing method, and the dispersion method.

The dyeing method dyes a synthetic high polymer or a natural protein such as gelatin, glue, or casein to obtain a color filter. The color filter made by this method, however, however, has difficulties regarding storage stability in a moist environment, light resistance, and heat resistance, and in larger display devices, difficulty in uniform control of dyeing and adhesive characteristics leading to difficulties in the control of film thickness and unevenness of color.

In the electrodeposition method, color pixels are formed by applying a voltage to a transparent electrode, formed in advance in a specified pattern, and immersing the electrode in a bath having an ionized high polymer, which contains a pigment dissolved or dispersed in a solvent. The electrodeposition method requires a photolithography process, including transparent electrode coating for color filter forming, and an etching process, in addition to the forming process for the transparent display electrode. Any short-circuit results in a line defect, causing a drop in yield. Thus, electrodeposition is difficult to apply except in striped arrangements (which means that color filters are arranged in parallel), and it is difficult to control the transparent electrode film quality.

Printing includes such methods as dry offset printing and intaglio offset printing. But its use is limited because filtering of the ink is difficult due to its high viscosity, because defects are apt to occur due to dust, foreign matter, and the presence of the ink binder gel, and because there are problems of insufficient position accuracy and line width accuracy, and problems in surface smoothness. Thus, it is difficult to use for high resolution color displays having large screens.

The dispersion method forms color filters with pigment dispersed in a negative type photosensitive resin. The dispersion method can form colored pixels by a coating, exposure, and development process. The filter obtained by this method is stable against stresses such as light and heat because pigments are used. Further, position accuracy is adequate because patterning is done through use of photolithography. Thus it is optimal for high resolution color displays with large screen.

Japanese Published Unexamined Patent Application (PUPA) 63-128302 discloses a method in which colored pixels are formed by printing. Then pinhole defects are repaired. A black matrix is formed by exposing a black negative type photosensitive resin applied to the colored pixels from the transparent substrate side. The formed colored pixels are used as the photo mask.

According to the method of PUPA 63-128302, the black matrix portion and pinhole defective portions of the colored pixels will be of the same optical density, since the black matrix and the pinhole defects of the colored pixels are composed of and filled with black resist of the same material with the same film thickness. Because the light shielding by the black matrix requires an optical density of at least 2.0 ($\log 1/T$, where T is the transmission), the pinhole defects may be perceived as black defects, especially when a static picture is displayed.

The paper by T. Fukuchi, M. Suginoya, H. Kawamori, and K. Iwasa titled "Self-Alignment Fabrication of ITO Electrode Pattern on Electrodeposited Tricolor Filter in Black Matrix: An Application to STN-LCD" published on pages 388 to 391 of JAPAN DISPLAY '89, on Oct. 16, 1989, discloses the formation of a black matrix between colored pixels formed by electrodeposition, by exposing, from the transparent substrate side, a black negative type photosensitive resin applied to the entire surface after forming colored pixels by electrodeposition, using the colored pixels as the photo mask.

The paper by Fukuchi et al. (JAPAN DISPLAY, 1989) proposes only a method of providing a black matrix in self alignment but never suggests repairing color filter defects. If pinhole defects caused by the photolithographic process of forming the ITO electrode or caused by the electrodeposit filter forming process are present, the pinhole defects will be filled with a black resist having the same optical density as the black matrix and can be perceived as a black defect, particularly when a static picture is displayed, as in the case for PUPA 63-128302. Therefore, the method of repairing the defective portion and forming black matrix using the same material at the same time merely results in changing white defects into black defects, which are, after all, also perceived as defects when displayed. Thus, this cannot be said to be a true repair.

SUMMARY OF THE INVENTION

It is a primary object of the invention to provide a color filter having colored pixels which, even with defects produced in the filter, does not allow the defects to be perceived as defects when characters or graphics are displayed through the color filter.

A second object of the invention is to provide a simple method of repairing a color filter so that a defect produced on the color filter is not perceived as a defect when characters or graphics are displayed through the color filter.

A third object of the invention is to provide a color filter wherein, even with a defect which extends over a plurality of differently colored pixels, the defect is not perceived as a defect when characters or graphics are displayed through the filter.

A fourth object of the invention is to provide a simple method of repairing a color filter so that a defect which extends over a plurality of colored pixels is not perceived as a defect when characters and graphics are displayed through the filter.

A fifth object of the invention is to provide a liquid crystal display which, even when a defective portion is produced in color pixels of the color filter, does not allow it to be perceived as a defect when characters and graphics are displayed.

A sixth object of the invention is to provide a liquid crystal display wherein, even with a defective portion produced over a plurality of differently colored pixels, the defect is not perceived when characters and graphics are displayed.

To attain the primary object, in accordance with the present invention, defective parts of colored pixels are filled with a negative type photosensitive resin containing a pigment of the same color as the colored pixel.

To attain the second object, in accordance with the invention, a negative type photosensitive resin with a pigment of the same color as the defective colored pixel dispersed therein is applied to the defective colored pixels, the applied negative type photosensitive resin is exposed to light through the defective colored pixels, and the exposed negative type photosensitive resin is developed.

To attain the third object, in accordance with the invention, a defective portion extending over a plurality of differently colored pixels is filled with a negative type photosensitive resin colored gray with pigment.

To attain the fourth object, in accordance with the invention, a negative type photosensitive resin colored gray with pigment is applied to the plurality of colored pixels with the defect, the applied negative type photosensitive resin is exposed to light through the plurality of colored pixels having the defect, and the exposed negative type photosensitive resin is developed.

To attain the fifth object, in accordance with the invention, the defective portion of the color filter inserted between a transparent electrode and a liquid crystal material layer is filled with a negative type photosensitive resin containing a pigment of the same color as the colored pixel.

To attain the sixth object, in accordance with the invention, the defective portion extending over the plurality of differently colored pixels of the color filter inserted between a transparent electrode and a liquid crystal material layer is filled with a negative photosensitive resin colored gray with pigment.

BRIEF DESCRIPTION OF THE DRAWINGS

FIG. 1(a) to FIG. 1(c) are cross-sectional views showing successive steps of the process of an embodiment of the color filter repair method according to the invention;

FIG. 9(a) to FIG. 9(c) are cross-sectional views showing successive steps of an embodiment of the process for repairing a defect extending over colored pixels of two different colors.

DETAILED DESCRIPTION OF THE PREFERRED EMBODIMENTS

Figures 1A, 1B, 1C:
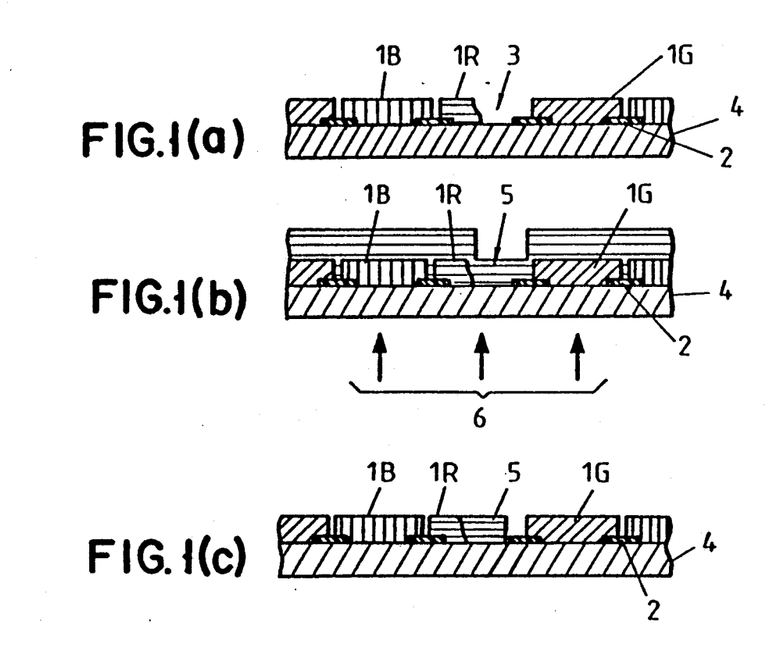
Figure 2:
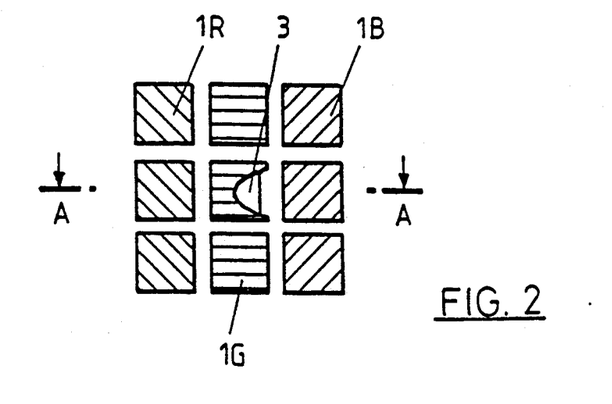
FIG. 2 is a plan view showing a color filter having a defect in its color pixels, for which the repair method shown in FIG. 1 is intended.
Figure 3:
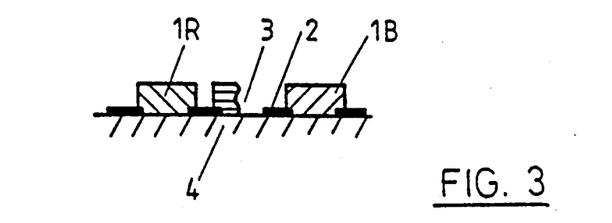
FIG. 3 is a section along line A—A of FIG. 2.

FIG. 1(a) to FIG. 1(c) illustrate the steps of a first embodiment of the color filter repair process according to the invention. FIG. 2 and FIG. 3 illustrate a color filter with a defect to which the repair process shown in FIG. 1 is applied. In FIG. 2 and FIG. 3, red pixels 1R, green pixels 1G, and blue pixels 1(B) are arranged on a transparent substrate 4 comprised of glass. The red, green, and blue pixels 1R, 1G and 1(B) are comprised of a negative type photosensitive resin containing pigments of the corresponding colors, respectively. As a general term representing the red, green, and blue pixels inclusively, "colored pixel" will be used hereinafter. Between the colored pixels, a black matrix 2 is provided for light shielding. The black matrix 2 can be formed of a metal such as chromium, or an organic film with a black coloring material (a pigment or dye) dispersed therein.

If there is a defect 3, such as a pinhole or a break, in the colored pixel containing the pigment and the negative photosensitive resin, light generated from a back light source leaks through defect 3 directly, which is different in brightness from the colored pixel portion. This is particularly easily perceived when a static picture is displayed. In this invention, the defective portion is repaired by filling it with a negative type photosensitive resin containing a pigment of the same color as the material forming the colored pixel.

When irradiated with light from the substrate 4 side (the lower side in FIG. 1(a) to FIG. 1(c)), the intensity and spectrum of light transmitted through the defective portion 3 is naturally different from the intensity and spectrum of light transmitted through the portion of a properly formed color filter. Since the light is transmitted only through the glass substrate 4, at the defective portion 3, the intensity and spectrum of light is not significantly changed, while in the portions formed of colored pixels 1R, 1G, and 1B, the light is attenuated by the amount of the light absorbed by the colored pixels. Therefore, the intensity and spectrum are very different from those of the light passing through the defective portion 3.

Figure 4:
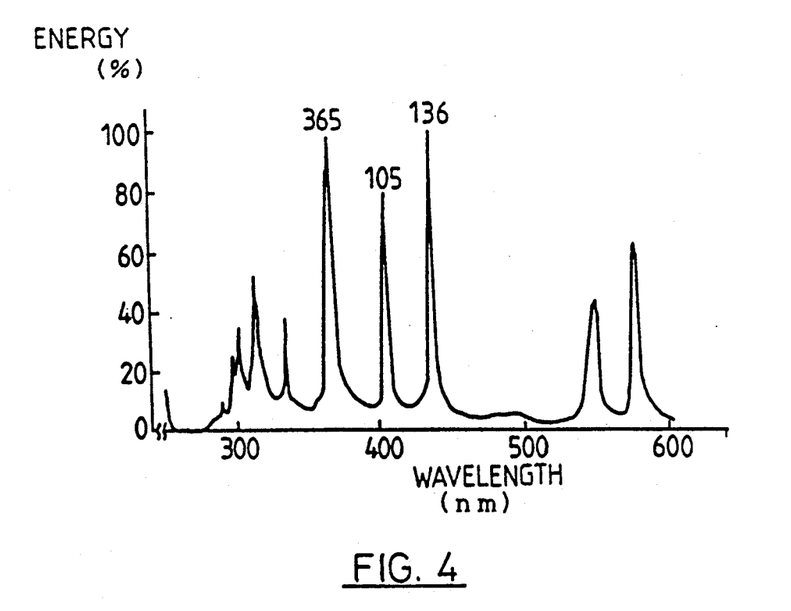
FIG. 4 is a spectrum diagram showing the emission spectrum of the light source used in the light exposure process in the repair method shown in FIG. 1.
Figure 5:
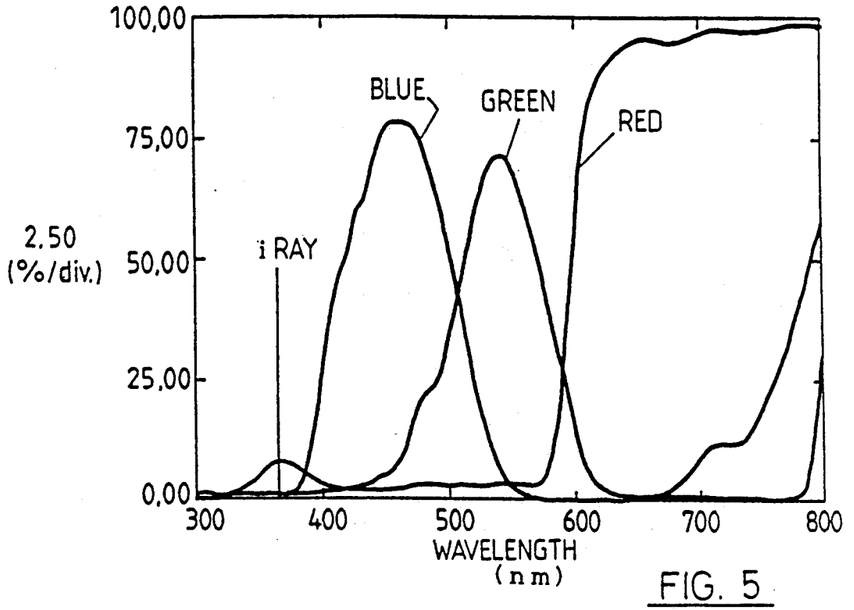
FIG. 5 is a spectrum diagram showing the spectral transmission spectrum of the red, green, and blue pixels of the color filter with defects acting as a photomask in the light exposure process of the repair method shown in FIG. 1.
Figure 6:
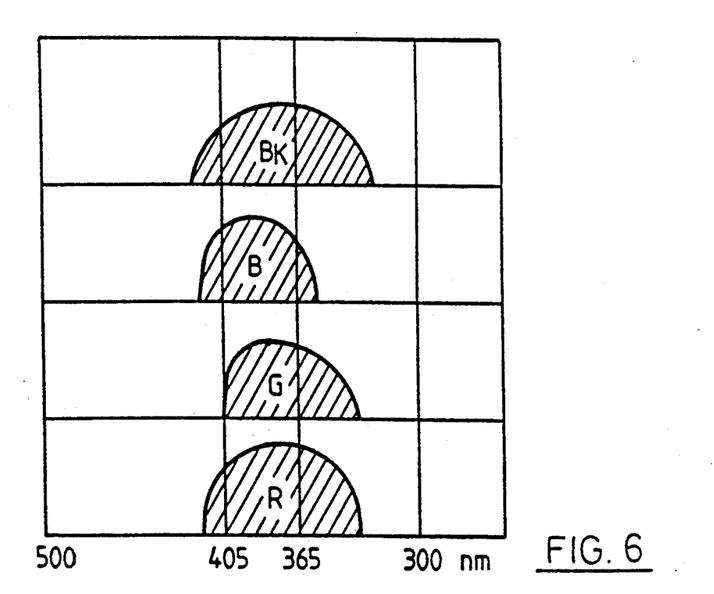
FIG. 6 is a graph showing the spectral sensitivity of the negative type photosensitive resin, containing pigment, used as a repair material.

FIG. 4 illustrates an emission spectrum of an extra-high voltage mercury-vapor lamp used as a light source for making repairs. FIG. 5 shows a spectral transmission spectrum of properly formed red, green, and blue colored pixels used as a photomask. FIG. 6 shows the relative spectral sensitivity of the negative type photosensitive repair resin with pigment dispersed therein. In FIG. 6, $B_K$, B, G, and R represent the relative spectral sensitivities of negative type photosensitive resins containing black, blue, green and red pigments, respectively. It is understood from FIG. 6 that the negative type photosensitive repair resin with pigment dispersed therein reacts mainly to light of the i-line (365 nm) during the formation of patterns, and from FIG. 5 that the transmittance at 365 nm is 7.6% for red pixels, 0.89% for green pixels, and 0.01% for blue pixels. Therefore, when applying the negative type photosensitive repair resin 5 with pigment dispersed therein on the pixels as shown in FIG. 1(a), and irradiating it with light 6, from the transparent substrate 4 side, through the colored pixels 1B, 1R, and 1G, as shown in FIG. 1(b), at the defective portion 3, the negative type photosensitive repair resin reacts and polymerizes, but the negative type photosensitive repair resin on the colored pixels 1B, 1R, and 1G does not react, because of the masking effect of the colored pixels, and is removed when developed. Accordingly, the defective portion is filled with the repairing material 5 in self alignment as shown in FIG. 1(c).

The negative type photosensitive resin satisfying the above conditions is, for example, a photo sensitive resin of radical polymerization type in which pigments of various colors in submicron particle diameters are dispersed, as described in Japanese PUPA 1-152449. This photosensitive resin comprises a polyfunctional acrylic ester monomer, trihalomethyl triazine type a photo polymerization initiator, and an acrylic acid/acrylic ester copolymer.

The color pigments of submicron particle diameter, which are to be dispersed in the negative type photosensitive resin, are of the same composition as each type of colored pixel already formed. Specifically, as the red pigment, at least one of an anthraquinone type pigment and a perylene type pigment, with which an isoindoline type yellow pigment or a disazo type yellow pigment is mixed, is used. As the green pigment, a halogenated phthalocyanine type pigment mixed with a disazo type yellow pigment or an isoindoline type yellow pigment is used. As the blue pigment, a phthalocyanine type pigment mixed with a dioxazine type violet pigment is used.

Figure 7:
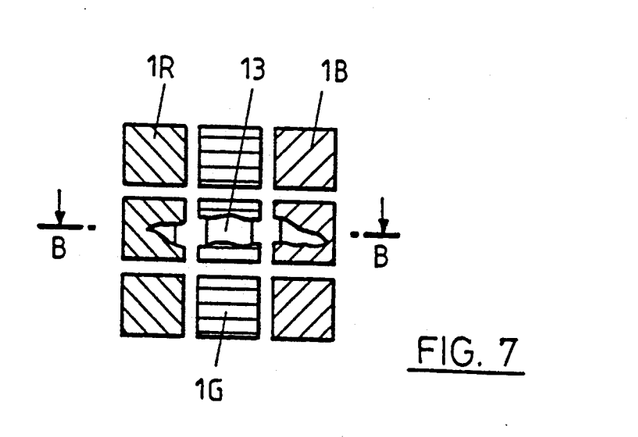
FIG. 7 is a plan view showing a color filter having a defect extending over a plurality of colored pixels of different colors.
Figure 8:
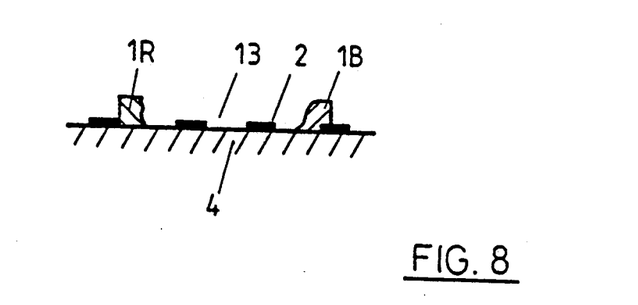
FIG. 8 is a section along line B—B of FIG. 7.

FIG. 7 and FIG. 8 show a color filter having a defect extending over a plurality of differently colored pixels. As shown in these figures, the presence of a defective portion 13 extending over differently colored adjacent pixels is easily perceived as a defect because the brightness of the defective portion 13 is different from that of the portion formed of colored pixels, leading to remarkably decreased display quality. If filled with a black material having the same optical density as the black matrix, as disclosed in PUPA 63-128302, such a defective portion is perceived as a black defect. Further, it may actually be impossible to achieve repair with a negative type photosensitive resin containing a pigment of each of the various specified colors by a single irradiation from the transparent substrate side, since the minute portions must be separately coated with a specified thickness. It may be possible by alignment using photomasks, but there may be little advantage in this, since the number of photo processes required would be equal to the number of defective colors.

The perception of such defects is not limited to the case of 8-color displays having red, green, and blue pixels or gradations thereof. However, the higher the resolution, the more distinct the defect becomes, as the difference in luminance from the surrounding pixels becomes greater. This is because the human eyes is more sensitive to brightness than to color itself. A pixel with an appropriately colored pixel arrangement displays red, green, blue, or medium tones of each and black, but the defective portion displays only white or black. In either case, brightness is higher than that of the portions in which colored pixels are formed, and it is necessary to decrease transmittance with a repair material.

In accordance with the invention it has been found that it is not only when the brightness is decreased that it is difficult to perceive a defect in a color display. When a material of an achromatic color or gray equal to the color temperature of white obtained according to an additive process of the various wavelengths of light coming out through the appropriately formed pixels of red, green, and blue is used, it is also difficult to perceive defects. An achromatic color material is perceived as a black defect in a white display when its transmittance is 30% or less, and looks white in a color display when its transmittance is 60% or more. It is thus clear that, when the opening ratio is about 50%, the optimum transmittance is 30-60%, where the opening ratio is defined as the difference between pixel area and black matrix area divided by pixel area (i.e. the area of the pixel that transmits light over the total pixel area.)

An available negative photosensitive resin suitable for filling the defective portion 13 extending over a plurality of adjacent differently colored pixels, is a radical polymerization type photosensitive resin, described in Japanese PUPA 1-152449, comprising a polyfunctional acrylic ester monomer, a trihalomethyl-triazine type photopolymerization initiator, and a copolymer of acrylic acid/acrylic ester. The photosensitive resin is dispersed with a submicron particle achromatic color pigment. As the achromatic color pigment, at least either one of carbon black or titanium carbon can be used, and, if required, a pigment for adjusting the color temperature may be added. The pigment for adjusting color temperature is finely dispersed in submicron particle size, as is the achromatic color pigment. Red, green, blue, yellow, and purple pigments are used as required.

Figures 9A, 9B, 9C:
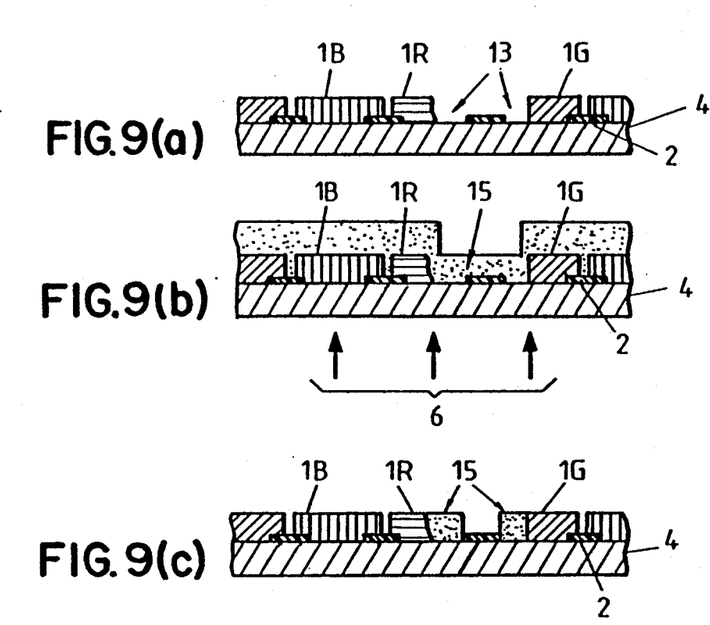

FIG. 9(a) to FIG. 9(c) illustrate the steps of the process according to the invention for repairing a defect extending over two differently colored pixels. FIG. 9(a) represents a color filter having a defective portion 13 extending over adjacent red pixel 1R and green pixel 1G. As shown in FIG. 9(b), a negative type photosensitive resin 15 colored gray or an achromatic color with a pigment, is applied on the colored pixels 1(B), 1R, and 1G, and the photosensitive resin is exposed to light from the transparent substrate side through the colored pixels 1B, 1R, and 1G. (The colored pixels work as photomasks.) Thereafter, the photosensitive resin 15 is developed. Then, only the negative type photosensitive resin 15, which has received light through the defective portion 13 remains, as shown in FIG. 9(c). The black matrix 2 has a light shielding function, and works as a photomask. Thus, when developed, the negative type photosensitive resin does not remain on the part of the substrate over black matrix 2.

EXAMPLE 1

On a transparent substrate 4 with a black matrix 2 formed thereon by use of chromium, COLOR MOSAIC CRY, CGY, and CBV made by Fuji-Hant Electronics Technology, Ltd. were successively applied. These are red, green, and blue pigments dispersed, respectively, in a negative type photosensitive resin. Then, the material is exposed, developed, and postbanked to form a color filter. To repair a defect 3 in the red pixel 1R, CRY was spin-coated thereon again, exposed to an extra-high tension mercury-arc lamp light from the transparent substrate 4 side through the colored pixels, and developed with a developing solution. The light exposure energy was set at 5 mJ/cm$^2$, since exposure with energy exceeding 5 mJ/cm$^2$ polymerized the photosensitive repair resin, even on appropriately formed red pixels 1R having no defects. Under the proper condition, as stated above, only the photosensitive resin in the defective portion is polymerized, and defect 3 may be filled with repair material 5. Then an ITO transparent electrode may be formed by sputtering onto the color filter. The color filter with the ITO electrode may be combined with a TFT substrate to produce a liquid crystal cell. Picture display may be conducted using this liquid crystal cell, and the defective portion can not be identified.

EXAMPLE 2

On a transparent substrate 4 with a black matrix 2 formed thereon by use of chromium, COLOR MOSAIC CRY, CGY, and CBV made by Fuji-Hant Electronics Technology, Ltd. which are red, green and blue pigments dispersed, respectively, in a negative type photosensitive resin, were applied successively to form a color filter by light exposure, developing, and post-baking processes. To repair a defect produced, which extends over adjacent pixels of the three colors of red, green, and blue, black pigment (carbon black), blue pigment (phthalocyanine blue), and purple pigment (quinacridone red) were mixed together, dispersed in the negative type photosensitive resin solution and again applied, so that the transmittance became 40% when the film thickness was the same as that of the colored pixels (2 micron), and so that the same color temperature (9000° K.), as the white color resulting from the additive color mixing of red, green, and blue is obtained when the display is used. Only the defective portion 13 was filled by exposing the assembly to light having an intensity of 5 mJ/cm$^2$ or less, from the extrahigh tension mercury-arc lamp, from the transparent substrate 4 side through the colored pixels, and by developing. After forming an ITO transparent electrode, a liquid crystal cell was formed (in combination with a TFT substrate) and the liquid crystal cell was used for display purposes. During such display use the defect can hardly be perceived. If a repair was not made, it would look like a twinkling star and would be readily apparent.

Figure 10:
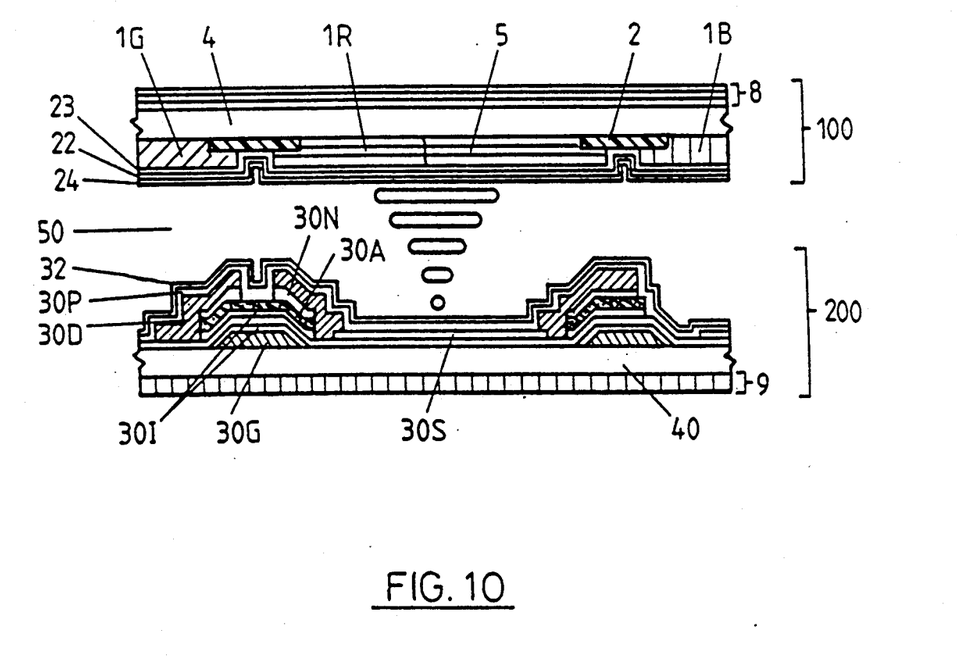
FIG. 10 is a sectional view showing an example of a liquid crystal display device with a color filter repaired according to the embodiment of the process of the invention shown in FIG. 1.

FIG. 10 shows an example of a liquid crystal display including a color filter repaired by the method illustrated in FIG. 1. A nematic liquid crystal material layer 50 is placed between a color filter substrate 100 and a TFT substrate 200. The color filter substrate 100 is provided with, in addition to the transparent glass substrate 4 (as shown in FIG. 1), a polarizing plate 8; the red, green, and blue pixels 1R, 1G, and 1(B); the black matrix 2; and the negative type photosensitive resin 5 containing red pigment filling in the defective portion, a top coat layer 23, an ITO common electrode 22 formed on the entire surface, and a liquid crystal orientation film 24 comprising, for example, polyimide, formed on this electrode. The TFT substrate 200 is provided with a transparent glass substrate 40, a polarizing plate 9, a gate electrode 30G, a gate insulation film 30I, an a-Si layer 30A, and n+a-Si layer 30N, an ITO pixel electrode 30S, a source drain electrode 30D, a passivation layer 30P, and a liquid crystal orientation film 32.

In the example of FIG. 10, an ITO electrode is provided on the color filter, but as in Japanese PUPA 63-298304, a color filter may be provided on the ITO electrode.

It may be apparent to those skilled in the art that it is possible to incorporate the color filter repaired by the method illustrated in FIG. 9 into a liquid crystal display such as the structure in FIG. 10.

Thus, the present invention can remarkably improve display quality when defects are produced in color filters during the manufacturing process. When the defect is one color, the defective portion is filled with a negative type photosensitive resin of the same color as the defective pixels, and when the defect extends over pixels of a plurality of colors, the defective portion is filled with a negative type photosensitive resin of gray color. Advantageously, in accordance with the invention, a necessary portion can be repaired simply, because the repair is done with a self-aligning technique using the color filter as a photomask.

Because the negative type photosensitive resin containing black pigment disclosed in PUPA 63-128302, and the black negative type photosensitive resin disclosed in the paper by T. Fukuchi et al. have a spectral sensitivity region different from that of the negative type photosensitive resin containing red, blue, or green pigment or the negative type photosensitive resin colored gray by a pigment which are used in the present invention, as described above, the effectiveness of a negative type photosensitive resin containing each color pigment as a repair material is uncertain unless verified by experiment or other method. Thus, the technique disclosed in PUPA 63-128302 does not suggest the present invention.

While this invention has been described in connection with specific embodiments, it will be understood that those with skill in the art may be able to develop variations of the disclosed embodiments without departing from the spirit of the invention or the scope of the following claims:

What is claimed is:

1. A color filter comprising:
   a plurality of colored pixels:
   at least one of said pixels having a defect therein; said defect being filled with a negative type photosensitive resin containing a pigment of the same color as that of said pixel.

2. The color filter according to claim 1, wherein said colored pixels comprises a negative type photosensitive resin containing a pigment.

3. A method for repairing a defect in a color filter having colored pixels, comprising the steps of:
   applying to said colored pixels having the defect a negative type photosensitive resin in which is dispersed a pigment of the same color as said colored pixels having the defect;
   exposing said applied negative type photosensitive resin to light through said colored pixels having the defect; and
   developing said exposed negative type photosensitive resin.

4. A color filter comprising:
   a plurality of colored pixels of different colors;
   a defective portion extending over a plurality of colored pixels of different colors, said defective portion being filled with a negative type photosensitive resin, said resin containing a pigment which colors said resin gray.

5. The color filter of claim 4, wherein light transmittance of said gray colored negative type photosensitive resin is approximately 30% to approximately 60%.

6. The color filter of claim 4 wherein color temperature of said gray colored negative type photosensitive resin is equal to that of a white color resulting from the additive color mixing of the colored pixels of the filter.

7. A method for repairing a defect extending over a plurality of colored pixels of different colors, comprising the steps of:

applying to the plurality of colored pixels having said defect a negative type photosensitive resin containing a pigment which colors the resin gray;

exposing said applied negative type photosensitive resin to light through said plurality of colored pixels with the defect; and developing said exposed negative type photosensitive resin.

8. The method of claim 7 wherein the color temperature of said gray colored negative type photosensitive resin is equal to that of the white color resulting from the additive color mixing of the colored pixels of the filter.

9. A liquid crystal display device comprising:
a liquid crystal material layer interposed between a pair of transparent substrates, and
a color filter having colored pixels interposed between one of said pair of transparent substrates and said liquid crystal material layer;

wherein the defective portion of said colored pixels is filled with a negative type photosensitive resin containing a pigment of the same color as said colored pixels.

10. A liquid crystal display device comprising:
a liquid crystal material layer interposed between a pair of transparent substrates, and
a color filter having a plurality of colored pixels interposed between one of said pair of transparent substrates and said liquid crystal material layer;

wherein the defective portion extending over the differently colored pixels of said color filter is filled with a negative type photosensitive resin colored gray with a pigment.

11. The liquid crystal display device of claim 10 wherein the color temperature of said gray colored negative type photosensitive resin is equal to that of a white color resulting from additive color mixing of the colored pixels of the filter.

* * * * *